(12) United States Patent
Glebov et al.

(10) Patent No.: US 7,326,500 B1
(45) Date of Patent: *Feb. 5, 2008

(54) SENSITIZATION OF PHOTO-THERMO-REFRACTIVE GLASS TO VISIBLE RADIATION BY TWO-STEP ILLUMINATION

(75) Inventors: Leonid B. Glebov, Orlando, FL (US); Vadim I. Smirnov, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 366 days.

This patent is subject to a terminal disclaimer.

(21) Appl. No.: 10/665,339

(22) Filed: Sep. 19, 2003

Related U.S. Application Data

(63) Continuation-in-part of application No. 09/750,708, filed on Dec. 28, 2000, now Pat. No. 6,673,497, which is a continuation-in-part of application No. 09/648,293, filed on Aug. 24, 2000, now Pat. No. 6,586,141.

(60) Provisional application No. 60/174,432, filed on Jan. 4, 2000.

(51) Int. Cl.
*G03H 1/04* (2006.01)
(52) U.S. Cl. ............... 430/1; 430/2; 359/3; 359/35; 359/24
(58) Field of Classification Search .............. None
See application file for complete search history.

(56) References Cited

U.S. PATENT DOCUMENTS

| | | | | |
|---|---|---|---|---|
| 3,630,765 A | * | 12/1971 | Araujo | ............ 501/13 |
| 3,640,604 A | | 2/1972 | Yarnell | ............ 350/162 SF |
| 3,675,990 A | | 7/1972 | Kogelnik et al. | ............ 350/311 |
| 4,017,318 A | * | 4/1977 | Pierson et al. | ............ 501/13 |

(Continued)

FOREIGN PATENT DOCUMENTS

JP          03-081718          4/1991

OTHER PUBLICATIONS

Bukharev et al., "Recording of holograms on radiation color centers in glass", Pis'ma v Zhurnal Tekhnicheskoi Fiziki vol. 1(21) pp. 975-977 (1975)(Abstract only).*

(Continued)

*Primary Examiner*—Martin Angebranndt
(74) *Attorney, Agent, or Firm*—Brian S. Steinberger; Phyllis K. Wood; Law Offices of Brian S. Steinberger, P.A.

(57) ABSTRACT

Photo-thermo-refractive (PTR) glass is a multi-component silicate glass having photosensitivity in rear UV region. A novel process is disclosed for PTR glass sensitization to visible region by means of two-step illumination followed by thermal development. This disclosed process utilizes a first illumination at approximately 325 nm followed by a second illumination with radiation in the visible spectral region out of the region of original photosensitivity of the PTR glass which enables fabrication of complex holographic optical elements for visible region such as plane elements, lenses, curved mirrors, combinations of complex elements and optical correlators. The same process provides a positive increment of refractive index in the bulk of the PTR glass and, therefore, can be used for refractive optical elements recording, such as lenses and waveguides.

24 Claims, 4 Drawing Sheets

U.S. PATENT DOCUMENTS

| | | | | |
|---|---|---|---|---|
| 4,057,408 | A | | 11/1977 | Pierson et al. .................. 65/18 |
| 4,125,404 | A | * | 11/1978 | Araujo et al. .................. 501/13 |
| 4,125,405 | A | * | 11/1978 | Araujo et al. .................. 501/13 |
| 4,514,053 | A | | 4/1985 | Borrelli et al. .......... 350/162.2 |
| 4,541,694 | A | | 9/1985 | Sullivan et al. ............. 350/371 |
| 4,567,104 | A | | 1/1986 | Wu ........................... 428/410 |
| 4,670,366 | A | | 6/1987 | Wu ............................. 430/13 |
| 4,894,303 | A | | 1/1990 | Wu ............................. 430/13 |
| 4,946,253 | A | | 8/1990 | Kostuck ..................... 350/169 |
| 4,965,152 | A | | 10/1990 | Keys et al. ..................... 430/1 |
| 4,979,975 | A | * | 12/1990 | Borrelli et al. ............ 65/30.11 |
| 5,078,771 | A | | 1/1992 | Wu ........................... 65/30.11 |
| 5,098,803 | A | | 3/1992 | Monroe et al. ................. 430/1 |
| 5,196,282 | A | | 3/1993 | Knobbe ......................... 430/2 |
| 5,285,517 | A | | 2/1994 | Wu ........................... 385/142 |
| 5,339,305 | A | | 8/1994 | Curtis et al. ................ 369/112 |
| 5,486,934 | A | | 1/1996 | Huang ......................... 359/15 |
| 5,684,611 | A | | 11/1997 | Rakuljic et al. ............... 359/7 |
| 6,376,010 | B1 | * | 4/2002 | Blackwell et al. ........ 427/163.2 |
| 6,566,626 | B2 | * | 5/2003 | Gaissinsky et al. .... 219/121.69 |
| 6,586,141 | B1 | * | 7/2003 | Efimov et al. ................... 430/1 |
| 6,673,497 | B2 | * | 1/2004 | Efimov et al. ................... 430/1 |
| 2003/0015509 | A1 | * | 1/2003 | Gaissinsky et al. .... 219/121.85 |
| 2005/0207466 | A1 | * | 9/2005 | Glebov et al. ................ 372/92 |

OTHER PUBLICATIONS

Seward, "Thermally darkenable photochromic glasses", J. Appl. Phys., vol. 46(2) pp. 689-694 (1975).*

Yokota, "Color centers in alkali silicate glasses containing alkaline earth ions", vol. 101(2) pp. 522-525 (1956).*

Anlkin et al., J. Noncryst. Sci., vol. 34(3) pp. 393-403 (abstract only) (1979).*

Bukharaev, et al., Physica Status Solidl A: Appl. Research vol. 50(2) pp. 711-716 (1978)(abstract only).*

Glebov et al., Doklady Akademii Nauk SSSR vol. 312(4) pp. 852-854 (1980)(abstract only).*

Willaims, "Permanent photowritten optical gratings in irradiated silicate glasses", Opt. Let.., vol. 17(7) pp. 532-534 (1992).*

Bukharev et al., "Recording of holograms on radation color centers in glass", Pis'ma v Zhurnal Tekhnicheskoi Fiziki vol. 1(21) pp. 975-977 (1975).*

Anikin et al., J. Noncryst. Sol., vol. 34(3) pp. 399-403 (1979).*

Bukharaev, et al., "Laser and thermal bleaching of color centers in sodium borate glasses", Physica Status Solidi A: Appl. Research vol. 50(2): pp. 711-716 (1978).*

Glebov et al., "New type of hologram recording in planar waveguides based upon glass", Doklady Akademii Nauk SSSR vol. 312(4) pp. 852-854 (1990).*

Efimov et al., "high-efficiency bragg gratings in photothermorefractive glass", Appl. Opt. vol. 38(4) pp. 619-627, (Feb. 1999).*

Glebov, "photochromic and photo-thermo-refractive glasses", in "Encyclopedia of Smart Materials", pp. 770-780 (2002).*

Glebov, "Volume hologram recording in inorganic glasses", Glass. Sci. Technol. , vol. 75 C1 pp. 73-90 (2002).*

Bukharaev et al., "recording of a three dimensional hologram with radiative color centers in glass", Sov. Tech. Phys. Lett., vol. 1(11) pp. 421-422 (Nov. 1975).*

Kondrashov et al., The holographic chracteristic cureves of photochromic glasses Opt. Technol. vol. 39 (8) pp. 482-485 (Aug. 1972).*

Sukhanov et al., "photochromic glasses as hologram recording media", Opt. Technol., vol. 37(12) pp. 796-797 (Dec. 1970).*

*Optical Holography Principles, techniques and applications*, second edition, P. Hariharan, Cambridge University Press, pp. 95-97 (1996).

*Full-Color Photosensitive Glass*, S. Donald Stookey, George H. Beall and Joseph E. Pierson, Journal of Applied Physics, vol. 49, No. 10, Oct. 1978, pp. 5114-5123.

*Photolytic Technique for Producing Microlenses in Photosensitive Glass*, Borelli, Morse, Bellman and Morgan, Applied Optics, vol. 24, No. 16, Aug. 15, 1985, pp. 2520-2525.

*Photothermal Refractive Effect in Silicate Glasses*, Borgman, Glebov, Nikonorov, Petrovskii, Savvin and Tsvetkov, Sov. Phys. Dokl, vol. 34, No. 11, Nov. 1989, pp. 1011-1013.

*Polychromic glasses—A New Material for Recording Volume Phase Holograms,* Glebov, Nikoronov, Panysheva, Petrovskii, Savvin, Tunimanova and Tsekhomskiir, Sov. Phys. Dokl, vol. 35, No. 10, Oct. 1990, pp. 878-880.

*New Ways to Use Photosensitive Glasses for Recording Volume Phase Holograms*, Glebov, Nikoronov, Panysheva, Petrovskii, Savvin, Tunimanova, and Tsekhomskii, Opt. Spectrosc., vol. 73, No. 2, Aug. 1992, pp. 237-241.

*Photo-Induced Processes in Photo-Thermo-Refractive Glasses*, Glebov, Glebova, Richardson and Smirnov, XVII International Congress on Glass, San Francisco, CA, Jul. 5-10, 1998.

*High-Efficiency Bragg Gratings in Photothermorefractive Glass*, Efimov, Glebov, Glebova, Richardson and Smirnov, Applied Optics, vol. 38, No. 4, Feb. 1999, pp. 619-627.

*Photo-Thermo-Refractive Glasses for High-Efficiency Bragg Gratings in UV, Visible and IR Regions*, Efimov, Francois-Saint-Cyr, Glebov, Glebova, Richardson and Smirnov, (2000) p. 185 Conference on Lasers & Electrooptics, 2000.

(1979) A.P. Gararin, L.B. Glebov, O.M. Efimov, O.S. Efimova. Formation of color centers in sodium calcium silicate glasses with the nonlinear absorption of powerful UV radiation. Sov. J. Glass Phys. Chem. 5, pp. 337-340.

(Aug. 1988) IBM Tech. Discl. Bull., vol. 31(3), pp. 18-23.

(1997) A.V. Dotsenko, L.B. Glebov, V.A. Tsekhomsky, Physics and Chemistry of Photochromic Glasses. CRC Press, Boca Raton, NY., pp. 9-11.

(1999) Efimov, et al. "Laser-induced Damage of Photo-Thermo-Refractive Glasses for Optical-Holographic-Element Writing", SPIE vol. 3578, pp. 564-575.

(1999) O.M. Efimov, L.B. Glebov, S. Grantham, M. Richardson. Photoionization of silicate glasses exposed to IR femtosecond pulses. Journal of Non-Crystalline Solids, 253, 58-67.

(2002) O.M. Efimov, L.B. Glebov, H.P. Andre. Measurement of the induced refractive index in a potothermorefractive glass by a liquid-cell shearing inferometer. Appl. Optics, 41. 1864-1871.

* cited by examiner

SENSITIZATION OF PHOTO-THERMO-REFRACTIVE GLASS TO VISIBLE RADIATION BY TWO-STEP ILLUMINATION

This invention is a Continuation in Part of U.S. Patent Application Ser. No. 09/750,708 filed Dec. 28, 2000 now U.S. Pat. No. 6,673,497, which is a Continuation-In-Part of U.S. Patent Application Ser. No. 09/648,293 filed Aug. 24, 2000 now U.S. Pat. No. 6,586,141, which claims the benefit of priority to U.S. Provisional Patent Application Ser. No. 60/174,432 filed Jan. 4, 2000, and was funded by the Air Forces Research Laboratory contract No. F496200100469.

FIELD OF THE INVENTION

This invention relates to diffractive and refractive optical elements produced by holographic or other photoinduced methods and in particular to the sensitization of doped photosensitive silicate glasses to visible radiation using a two-step illumination in the photo-thermo-refractive (PTR) process.

BACKGROUND AND PRIOR ART

Increasing applications for holographic optical elements have resulted in the continued development of new effective and reliable photosensitive media. P. Hariharan in his book "Optical Holography, Principles, Techniques, and Applications." Chapter 7 (Cambridge University Press, 1996) on pages 95 and 96 reports that the main photosensitive materials available for high efficiency hologram recordings are silver halide photographic emulsions, dichromated gelatin, photoresists, photopolymers, photothermoplastics, polymers with spectral hole-burning, and photorefractive crystals. Each of these materials has their merits, but all have drawbacks. These organic materials (photographic emulsions, dichromated gelatin, and photopolymers) are sensitive to humidity. Moreover, they significantly shrink in the development process. Inorganic materials (photorefractive crystals) have low resistance to elevated temperatures and produce additional patterns because of exposure to the beam diffracted from the recorded grating.

The ideal recording material for holography should have a spectral sensitivity well matched to available laser wavelengths, a linear transfer characteristic, high resolution, and low noise, be indefinitely recyclable or relatively inexpensive. Hariharan reports on page 95 of his earlier referenced book that "While several materials have been studied, none has been found so far that meets all these requirements". The lack of available materials for phase holographs has stimulated the search for new approaches.

A photo-thermal process based on precipitation of dielectric microcrystals in the bulk of glass exposed to UV radiation was reported by S. D. Stookey (see Photosensitive glass, (a new photographic medium). Industrial and Engineering Chem., 41, 856-861 (1949)). Stookey's two-step process (exposure and thermal development) was used to record a translucent image in glass because of light scattering caused by a difference between refractive indices of a precipitated crystalline phase and the glass matrix. Later, colored images were recorded in similar glasses by photo-thermal precipitation of a number of complex crystals of different compositions, sizes, and shapes. According to these studies, the first step is the exposure of the glass sample to UV radiation, which produces ionization of a cerium ion. The electrons released from cerium are then trapped by a silver ion. As a result, silver is converted from a positive ion to a neutral atom. This stage corresponds to a latent image formation and non significant coloration occurs.

The next step is thermal development. This development process includes two stages described in publications by S. D. Stookey, G. H. Beall, J. E. Pierson (see Full-color photosensitive glass. J. Appl. Phys., 49 (1978) 5114-5123) and N. F. Borrelli, J. B. Chodak, D. A. Nolan, T. P. Seward (see Interpretation of induced color in polychromatic glasses. J. Opt. Soc. Amer., 69 (1979) 1514-1519). The first stage involves the high diffusion rate silver atoms posses in silicate glasses. This diffusion leads to creation of tiny silver crystals at relatively low temperatures (450-500° C.). A number of silver clusters arise in exposed regions of glass after aging at elevated temperatures. These silver particles serve as the nucleation centers for sodium and fluorine ion precipitation and cubic sodium fluoride crystal growth occurs at temperatures between 500° C. and 550° C. Further heat treatment leads to growth of numerous elongated pyramidal complexes of (Na,Ag,F,Br) crystals on the surface of cubic NaF crystals.

This mixture of crystals can produce opal coloration in the case of large crystal sizes of yellow coloration caused by colloidal silver precipitated on interfaces of dielectric crystals. A second exposure to UV followed by a second heat treatment produces different coloration because of metallic silver reduction on the surfaces of the dielectric pyramids. The final resulting coloration depends on the size and aspect ratio of these silver particles. This multi-stage photo-thermal process in photosensitive glass was proposed for decoration, color photography, sculpture, and even for holography; however, no evidences of any hologram recorded in these glasses are in those references. Several years later, the use of inorganic photosensitive glasses for phase hologram recording rather than as a photographic medium was reported in the literature: Bragg gratings were obtained both in lithium-aluminum-silicate and sodium-zinc-aluminum-silicate glasses doped with silver and cerium by exposure to UV radiation followed by thermal treatment. This phenomenon was named the "photo-thermo-refractive" (PTR) process. Glasses, which posses such properties, were called "photo-thermo-refractive" (PTR) glasses.

It was further reported that a refractive index decrease of about $5 \times 10^{-4}$ occurs when dielectric crystals precipitated in PTR glasses are exposed to ultra violet (UV) radiation of a nitrogen laser at 337 nm. The refractive index of NaF in the red spectral regions is $n_{NaF}=1.32$ whereas the refractive index of PTR glasses $n_{PTRPTR}=1.49$. The small value of refractive index change is due to the small volume fraction of precipitated crystalline phases; however, it is sufficient to result in high efficiency Bragg grating recording in samples with thicknesses more than several hundreds of microns. Conditions of glass exposure and development were found in that work to create Bragg gratings with relative diffraction efficiencies up to 90% and angular selectivity up to 2 mrad. The maximum recorded spatial frequency was 2500 mm$^{-1}$. These gratings were also stable up to 400° C. UV photosensitivity was found in the range of several J/cm$^2$ at a nitrogen laser wavelength (337 nm). The absorption band of $Ce^{3+}$, which is used for photo-ionization, has maximum near 300 nm and a long wavelength tale up to 400 nm. This means that several commercial lasers such as $N_2$, Ar, He—Cd, etc., can be used for recording. Once delveoped, holograms in PTR glass were not destroyed by further exposure to visible light.

Unfortunately, these reported materials did not meet all requirements formulated in Hariharan, particularly absolute diffraction efficiency [P. Hariharan. Optical Holography, Principles, Techniques, and Applications," Chapter 7 pp. 95-124 (Cambridge University Press, 1996), Table 7.1 at page 96] because their property of excessive (strong) scattering of the radiation imposed on the hologram. This scattering results in low absolute diffraction efficiency of gratings in PTR glasses, which has been found not to exceed 45%. Thus, this PTR material for holographic optical elements had serious drawbacks; particularly, inadequate absolute diffraction efficiency which results in excessive scattering of the radiation as well as photosensitivity solely for UV radiation.

A new approach for the production of phase holographs having many of these desired properties is described in the patent utility application U.S. Pat. Application Ser. No. 09/750,708 filed Dec. 28, 2000. This Application teaches how a photo-thermal process based on precipitation of dielectric microcyrstals in the bulk of glass exposed to UV radiation can be used to record a high-efficiency volume phase hologram in glass having a photosensitivity to UV radiation resulting from the difference between refractive indices of—the UV exposed and unexposed areas of the PTR glass blank.

However, photosensitivity of PTR glass is restricted in the vicinity of the absorption band in the near UV spectral region. This restriction means that plane holographic elements could be fabricated with this method for visible and IR spectral regions while complex holograms could be recorded for the UV region only. It would be highly desirable to produce a recording material for holography with photosensitivity to visible radiation.

Another application of photosensitive materials which can increase their refractive index is the fabrication of refractive optical elements, such as lenses or waveguides as are described in the book by K. Hirao at al. (Active Glass for Photonics Applications. Springer-Verlag, Berlin 2001). However, the PTR glass was not used for such a technology because it showed a decrease of refractive index after UV exposure and thermal development. It would be highly desirable to produce a recording material for refractive optical elements and waveguides fabrication with high sensitivity, positive refractive index increment, and high tolerance to elevated temperatures, high-power optical radiation, and harsh environment conditions.

Thus, the need exists for solutions to the above problems.

SUMMARY OF THE INVENTION

The first objective of the present invention is to provide a method for preparing a holographic element by means of sensitization of recording medium to visible radiation.

The second objective of this invention is to provide a holographic element from photo-thermo-refractive (PTR) glass having spectral sensitivity shifted to visible region and well matched to available laser wavelengths.

The third objective of this invention is to provide a holographic element from having photo-thermo-refractive (PTR) glass a linear transfer characteristic, high resolution, and low noise.

The fourth objective of this invention is to provide a procedure of PTR glass fabrication which provides a recyclable or relatively inexpensive holographic element.

The fifth objective of this invention is to provide a method for preparing of refractive optical elements such as lenses, waveguides and max/demux devices from PTR glass.

Preferred embodiments of the invention include: a method of generating holograms from photosensitive photo-thermo-refractive (PTR) glasses comprising the steps of exposing PTG glass with a UV light source; exposing the UV exposed PTR glass with a Visible light source, thermal treating the UV and Visible light exposed PTR glass; and generating a hologram from the thermal treated PTR glass; (B) a method of generating of refractive optical elements from photosensitive PTR glass comprising the steps of: exposing PTR glass with UV light source, exposing the UV exposed PTR glass with a Visible light source; thermal treating the UV and Visible light exposed PTR glass; and generating a refractive optical elements such as a lens and waveguide from the thermal treated PTR glass; and (C) an optical element comprising: a photo sensitive refractive PTR glass having photosensitivity to visible light caused by UV exposure; means for exposing the UV exposed PTR glass to Visible light; means for thermal treating the UV and Visible light treated PTR glass; and, means for using the PTR glass as a volume refractive or holographic optical element.

Further objectives and advantages of this invention will be apparent from the following detailed description of the presently preferred embodiments which are disclosed in the following text and properties of which are illustrated in the accompanying drawings.

DESCRIPTION OF THE PREFERRED EMBODIMENTS

Figure 1:
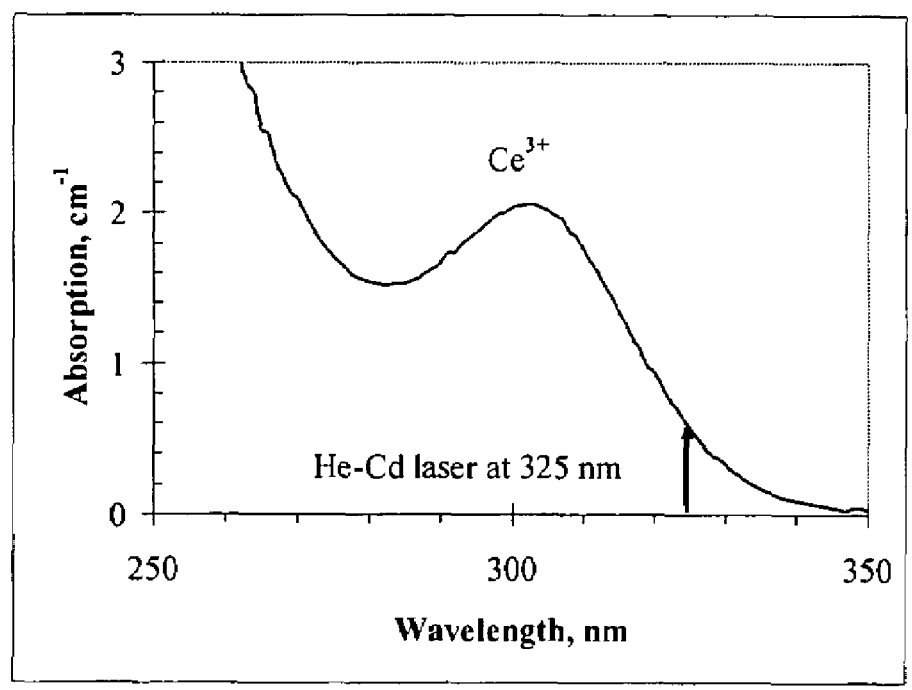
FIG. 1 shows absorption spectra of the original PTR glass.

Before explaining the disclosed embodiments of the present invention in detail, it is to be understood that the invention is not limited in its application to the details of any particular arrangements shown since the invention is capable of further embodiments. Also, the terminology used herein is for the purpose of description and not of limitation.

To overcome the drawbacks of the prior art in developing useful glass holograms, it was necessary to establish if the high losses (excessive scattering) are an intrinsic feature of photo sensitive refractive (PTR) glasses or, with proper choices of glass technology, conditions of exposure and/or thermal development, this phenomenon can be eliminated. To do this, studies were made of: PTR glass melting and samples preparation; absorption spectra of original, exposed and developed PTR glasses in the UV, visible and IR regions; Bragg grating optical properties versus conditions of PTR glass fabrication, UV exposure and thermal treatment; and, the types of losses, which appeared in the process of hologram recording.

These numerous studies have resulted in a unique process described in the patent utility application U.S. Pat. Application Ser. No. 09/750,708 filed Dec. 28, 2000 of common assignee with this application and fully incorporated herein by reference thereto that produces a new inorganic PTR glass as a medium for ultra violet (UV) hologram recording with the properties and performance which meets the requirements indicated above. The process with its steps of first fabricating the glass, then preparing the glass bank and fabricating it into an optical hologram is hereafter set forth:

1. PTR glass fabrication.

1.1. Batching. Weighing and mixing components (oxides, fluorides and salts) which are necessary for glass fabrication. Components should not contain impurities of iron and heavy metals above few parts per million.

1.2. Melting. Heating of batch in crucible at temperatures which range from approximately 1450 to approximately 1500° C. for several hours. Glass fabrication setup should prevent additional contamination of glass with iron and heavy metals.

1.3. Homogenization. Stirring the glass melt for several hours to average the composition through the volume.

1.4. Cooling. Fast cooling to temperatures approximately 500° C. in the crucible or by casting onto a metal slab.

1.5. Annealing. Aging the glass at temperature of approximately 460° C. for stress and structural relaxation followed by slow cooling to the room temperature with a cooling rate in the range of tenths or hundredths of degree per minute.

2. Blank fabrication.

2.1. Cutting. Slicing and dicing the glass slab to parts according to the holographic element size in accordance with specification. Routine sizes of diffractive elements a ranged from approximately few of millimeters to approximately several centimeters in diameter and from approximately several tenths to approximately several millimeters in thickness.

2.2. Grinding and polishing to secure glass element transparency in directions of writing and utilization.

3. Optical hologram fabrication.

3.1. Illumination setup design and fabrication for interference pattern generation at desirable wavelength with preset spatial frequency ranged up to approximately 10000 lines/mm.

3.2. Exposure of virgin glass blank to optical radiation in the range of glass photosensitivity (approximately 280 to approximately 380 nm) for dosage ranged from approximately 50 to approximately 5000 nJ/cm$^2$ for wavelength of approximately 325 nm. Optimal values of exposure are approximately 300 to approximately 600 mJ/cm$^2$.

3.3. Thermal development. Heating of exposed glass plate at temperatures ranging from approximately 480 to approximately 580° C. (optimal temperature is about 520° C.) for aging from several minutes to approximately several hours.

3.4. Second annealing. Aging the glass at temperature of approximately 460° C. for stress and structural relaxation followed by slow cooling to the room temperature with the cooling rate in the range of tenths or hundredths of degree per minute.

Thus the process of the invention involves the steps of: melting of the PTR glass mixture; annealing the homogenized melt; preparing glass samples of from approximately 0.5 to approximately 10 mm thickness having an absorption coefficient of less 1 cm$^{-1}$ for wavelengths ranging from approximately 280 approximately 380 nm; irradiating said sample with a patterned beam of radiation ranging from approximately 50 mJ/cm$^2$ to approximately 5000 mJ/cm$^2$, and thermal developing the PTR glass at temperatures from approximately 500° to approximately 650° C. for a period of from a approximately few minutes to approximately several hours; whereby a Bragg grating having an absolute diffraction efficiency of at least approximately 90% is realized.

The photosensitive glass of composition (mol. %) 13.6Na$_2$O-5.2ZnO-2.3Al$_2$O$_3$- 72.3SiO$_2$-3.7NaF-1.5KBr-1.3AlF$_3$-0.01Ag$_2$O-0.01CeO$_2$-0.02SnO$_2$-0.03Sb$_2$O$_3$ used in this work had a total contamination with iron and heavy metals below 5 parts per million and glass melting technology providing no additional contaminations.

The glass was melted in an electrical furnace (DelTech model DT-31-RS-OS) in 400 ml fused silica or platinum crucibles at approximately 1460° C. for approximately 5 hours with stirring to homogenize the melt. After the melting, the glass was poured onto a thick metal slab or cooled in the crucible to the annealing temperature. For structural and stress relaxation, the glass casting underwent annealing at approximately 460° C. for several hours and then cooled to the room temperature with cooling rate of approximately 0.2°/min. Thermal development was controlled by keeping the exposed speciment in the same furnace at a preferred temperature of approximately 520° C., although temperatures from approximately 500° C. to approximately 650° C. can be used, from periods of a few of minutes to several hours. Polished glass samples from approximately 0.5 mm to approximately 10 mm thickness of 25×25 mm size were prepared by using P. R. Hoffman two-side grinding and polishing machines. Optical homogeneity of samples was determined by liquid-cell interferometer with accuracy of 10$^{-6}$. Samples with refractive index fluctuations below 10$^{-4}$ were selected for diffractive element recording.

Absorption spectra of PTR glasses shows the UV part of absorption spectrum based on the wide absorption band of Ce$^{3+}$ with maximum at approximately 305 nm. The range of photosensitivity of this glass is from approximately 280 to approximately 350 nm with absorption of the PTR glass less than approximately 0.01 cm$^{-1}$ in the visible and near IR regions which indicates—that PTR glass is more transparent than usual optical crown glass and can be used in the near UV, visible and IR region up to approximately 4000 nm.

The durability of holograms in PTG glasses is remarkable for it was found that secondary heat treatment up to approximately 400° C. does not reduce diffraction efficiency. The developed holograms were exposed to radiation of 100 W Yb laser at approximately 1096 nm, 20 nW He—Ne laser at approximately 633 nm and 30 mW He—Cd laser at approximately 325 nm for approximately 5 to approximately 8 hours without any holograms destruction.

A goal of the invention is to shift a spectrum of photosensitivity of PTR glass to a longer wavelength region, which paves a way to the technology of complex nonplanar hologram recording and to convert the refractive index decrement to an increment, which paves the way to the broadening the useful technology of refractive optical elements recording.

Reference should now be made to FIG. 1 which shows the absorption spectrum of the PTR glass. The absorption band having the maximum at approximately 305 nm belongs to $Ce^{3+}$ which as earlier discussed is one of the components of this glass. Excitation of cerium to an upper state triggers all photo and thermo-induced processes that finally result in a refractive index decrement. The standard writing wavelength is approximately 325 nm which is placed at long-wavelength tail of $Ce^{3+}$ absorption band (FIG. 1). No additional absorption bands as earlier discussed can one see in visible region above approximately 400 nm. It was earlier emphasized that illumination of this glass with wavelengths exceeding approximately 400 nm did not cause refractive index increment.

A main idea of this invention is to use a two-step illumination procedure expecting that the first step can create some new color centers which have sensitivity at longer wavelengths. The mechanism of a secondary photosensitivity is optical excitation of those color centers generated in the first step. In this case the first illumination can be done by a uniform beam, while the second illumination would record a hologram. One can see in FIG. 2 that illumination of PTG glass with approximately 325 nm (marked with arrow in FIG. 1) actually results in some additional absorption in long wavelength region compare to the absorption spectrum of the original glass. However, no induced absorption or refraction was found after the second illumination of UV exposed PTR glasses with different sources with wavelengths above approximately 400 nm.

Figure 2:
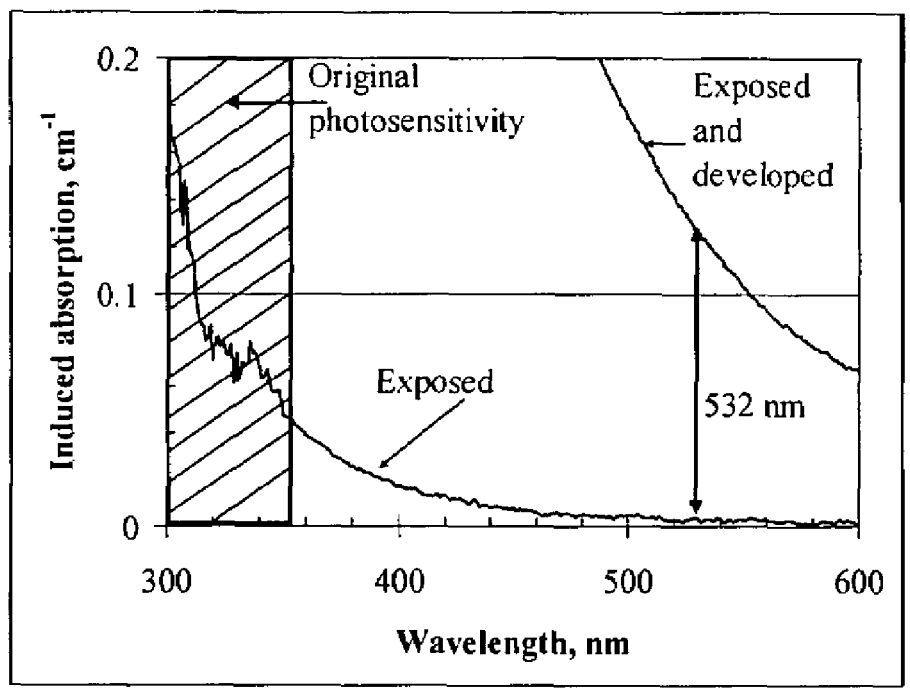
FIG. 2 shows the additional absorption spectra of the original PTR glass after UV exposure and UV exposure followed by thermal development at approximately 520 degrees C.

One can see an increase of the induced absorption in long wavelength region after thermal development of PTR glass (FIG. 2). However, the second illumination of a developed glass sample with long wavelength radiation did not cause any additional refraction.

Another idea for spectral shift to long wavelength region is based on the use of nonlinear processes where multiphoton, multistep, cooperative or other nonlinear process can provide excitation of photosensitive centers to upper levels when energy gap exceeds photon energy. However, it was found that at reasonable levels of power density provided by nanosecond pulsed lasers in visible and near IR regions did not cause induced refraction in PTR glasses. Induced refraction in PTR glass was discovered only after illumination with femtosecond pulses at power density about $10^{12}$ W/cm$^2$ (See; O. M. Efimov, L. B. Glebov, S. Grantham, M. Richardson. Photo ionization of silicate glasses exposed to IR femtosecond pulses. *Journal of Non-Crystalline Solid*, 253, (199) 58-67). However, this phenomenon is a subject of the separate research.

The next approach was a consequent use of the previous linear and nonlinear approaches. The primary UV illumination ranges from approximately 280 to approximately 350 nm, preferably approximately 325 nm while the second visible light illumination ranges from approximately 450 to approximately 600 nm, preferably approximately 532 nm. Actually, any types of ionizing radiation (UV, X-ray, etc.) could be used for the first irradiation of the glass sample. Exposing dosage at approximately 325 nm was varied from 1 to 30 J/cm$^2$. The visible light illumination is provided by a high power source generating at approximately from 10 megawatts/cm$^2$ to approximately 100 gigawatts/cm$^2$, preferably approximately 10 gigawatts/cm$^2$.

The invention described herein makes possible the fabrication of both a simple hologram having substantially planar surface of equal refractive index and a complex hologram having substantially curved surfaces of equal refractive index. After the second illumination of the PTR glass, the glass is exposed to a thermal treatment in a temperature region ranging from approximately 480 to approximately 580° C. for a period from a few minutes to several hours appropriate for phase transformation.

Figures 3, 3A, 3B, 3C:
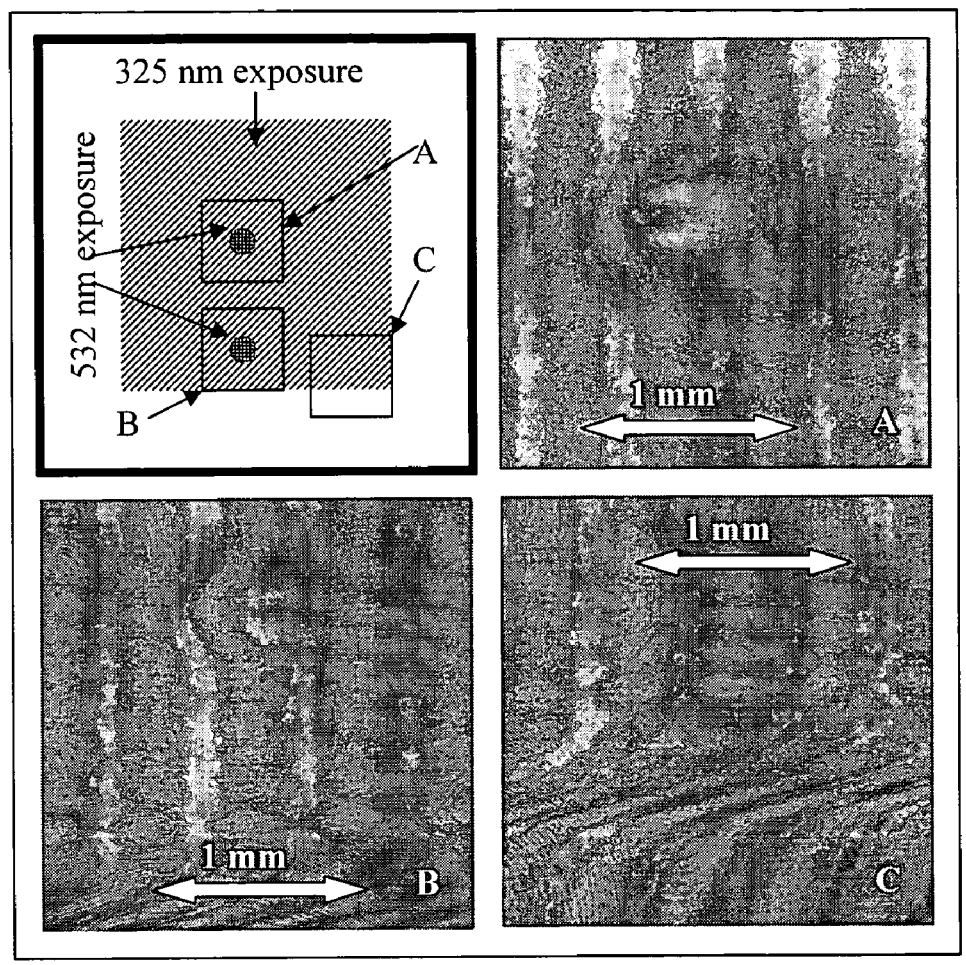
FIG. 3 illustrates the interfereograms of a PTR sample after UV exposure at approximately 325 nm (square spot) followed by visible exposure at approximately 532 nm (round spots) and thermal development at approximately 520° C.
FIG. 3A shows UV exposure is approximately 1 J/cm$^2$ (curve 1) and visible exposure is approximately 10 ns pulses at approximately 14 Hz repetition rate for approximately 120 s focused on a spot of approximately 100 μm diameter at power density of approximately 60 GW/cm$^2$.
FIG. 3B shows UV exposure is approximately 1 J/cm$^2$ (curve 1) and visible exposure is approximately 10 ns pulses at approximately 14 Hz repetition rate for approximately 120 s focused on a spot of approximately 100 μm diameter at power density of approximately 30 GM/cm$^2$.
FIG. 3C shows the border of a UV exposed area.

Thus, the successful approach was a combination of two-step and nonlinear approaches. It was found that exposure of UV radiated PTR sample to radiation of the second harmonic of neodymium laser at approximately 532 nm caused some photoinduced phenomena. Refer now to FIG. 3 which shows inteferograms of such a sample after thermal development. One can see in FIG. 3A that the round area exposed to 532 nm shows phase distortions about 2 fringes. This means that its refractive index is changed significantly compare to the rest of the UV exposed area. FIG. 3B shows the round spot exposed to the same dosage at approximately 532 nm with less power density. One can see the edge of the UV exposed area in the bottom of FIG. 3B. FIG. 3C shows the transition from an unexposed area to the UV exposed one.

The fringe shift from left to right in the area upward from the bottom in FIG. 3C results from the refractive index decrease in an UV exposed area compared to that in the unexposed one. The thickness of the transition area of approximately 500 µm is connected with sharpness of the projected UV pattern. The small-scale round area underwent double UV and visible exposure (FIGS. 3A and 3B) and shows a fringe shift in the opposite direction. This means that the secondary exposure decreases the concentration of photo-thermo-induced crystalline phase in glass compared to that generated by UV exposure only. Actually, it was found that small induced absorption in blue region was partially bleached after the second exposure to pulsed radiation at approximately 532 nm. A conclusion can be made in this case that increasing of a refractive index in PTR glass after the second illumination is similar to bleaching of color centers produced in glasses by ionizing radiation.

Comparison of the fringe shifts in FIGS. 3A and 3B shows that the same dosage of visible radiation delivered with lower power density results in lower refractive index increment. It was found that for glass exposed to UV radiation for 1 J/cm$^2$ irradiation by visible light with power density below approximately 10 GW/cm$^2$ did not result in detectable refractive index variations. However, for glass exposed to UV radiation for approximately 30 J/cm$^2$ irradiation by visible light resulted in detectable refractive index variations for power density exceeding approximately 100 MW/cm$^2$. It was reported in O. M. Efimov, L. B. Glebov, H. P. Andre. Measurement of the induced refractive index in a photothermal refractive glass by a liquid-cell shearing interferometer. *Appl. Optics*, 41 (2002) 1864-1871, that refractive index decrement in PTR glass after linear excitation at approximately 325 nm (below 1 W/cm$^2$) occurs in accordance with a reciprocity law which means that the result of exposure depends on dosage but does not depend on power density of radiation. This means that discovered dependence of the value of induced refractive index on dosage of the primary UV illumination and power density of the second illumination (compare FIGS. 3A and 3B) proves that recorded effect results from a nonlinear process.

It was found that exposure of PTR glass to higher dosage of UV radiation results in decreasing of power density of visible radiation which caused refractive index modification. The lower power density at which induce refractive index was detected was approximately 100 MW/cm$^2$. At the same time, samples exposed to UV radiation have required a lower dosage which is necessary for photoinduced refractive index recording. A hologram was recorded after exposure of approximately 6 kJ/cm$^2$ at power density of approximately 100 MW/cm$^2$. It is believed that higher dosage of the primary UV illumination can provide even lower threshold of secondary photosensitivity.

The following conclusion can be drawn. Illumination of the PTR glass sample, which was previously exposed to UV radiation, by high-power pulses (>approximately 10 MW/cm$^2$) of the second harmonic of neodymium laser at approximately 532 nm results in partial bleaching of those centers that control precipitation of crystalline phase at the development process. The sensitivity of exposed PTR glass of the secondary illumination by visible radiation is lower compared to UV photosensitivity by several orders of magnitude but it is significantly higher compare to UV photosensitivity of Ge-dopes silica. Availability of high-power visible lasers with high quality of radiation encourages implementation of hologram recording by the two-step illumination of PTR glass according to this invention.

The phase shift between exposed and unexposed area in a hologram with 100% diffraction efficiency corresponds to a ½ fringe shift in shearing interferomoeter that was used in this work. The phase shift in FIG. 3 shows that the discovered phenomenon provides phase shift several times more than that value and, therefore, enables a fabrication of high-efficiency holograms by visible radiation produced by commercial lasers. Thus, this invention provides holographic optical elements which will facilitate fabrication of complex phase holographic elements which can serve as compact robust optical components of optical systems for military, optical communications, and data storage/processing.

Figure 4:
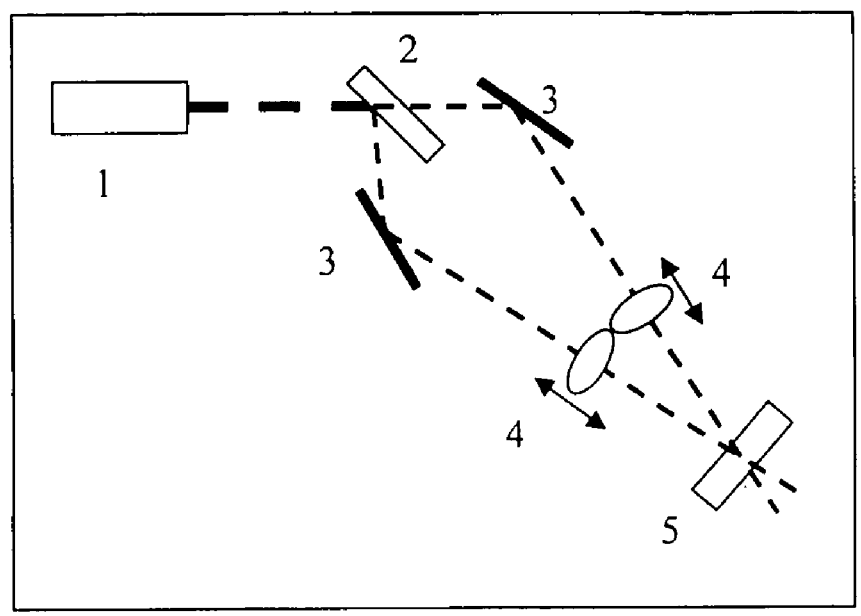
FIG. 4 is an illustrative diagram of a device for hologram recording in PTR glass according to the invention.

Reference should now be made to FIG. 4 which is an illustrative diagram of a device for hologram recording in PTR glass according to the invention. The device consists of a Minilite II Nd:YAG laser 1 providing an approximately 25 mJ/pulse at approximately 532 nm directed at a beamsplitter 2, which split radiation is focused onto mirrors 3A and 3B which then reflect each of the two respective beams onto each of the two focusing lenses 4A and 4B at the respective translational stages and thereafter onto the PTR glass sample 5. With this device holographic gratings were recorded in PTR glass exposed to approximately 30 J/cm$^2$ of approximately 325 nm UV radiation by irradiation of interfering beams of the second harmonic of Nd-laser at approximately 532 nm. Power density was varied from 100 MW/cm$^2$ in collimated beams to approximately 30 GW/cm$^2$ in focused beams. It was found that holograms recorded by collimated beams are planar Bragg gratings recorded for the whole thickness of the glass plate (up to approximately 3 mm in our experiments).

Figure 5:
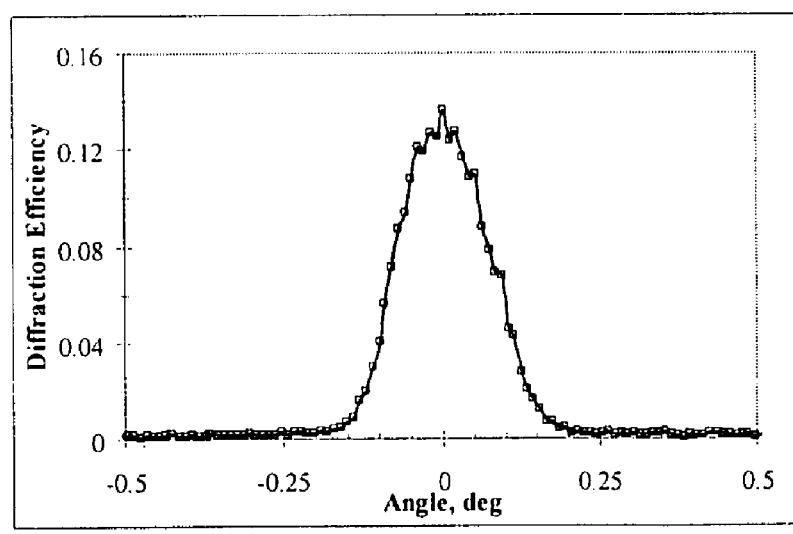
FIG. 5 graphically shows the dependence of diffraction efficiency of a PTR Bragg grating recorded by visible radiation at approximately 532 nm on detuning from Bragg angle FIG. 6 graphically shows the surface profile of UV exposed PTR glass irradiated by approximately 532 nm.

Refer now to FIG. 5 where the dependence of diffraction efficiency on detuning from Bragg angle is shown. One can see that absolute diffraction efficiency reaches approximately 14%. This means that this is definitely phase hologram generated by refractive index modulation in the volume of a photosensitive medium. The relatively low value of diffraction efficiency for this hologram is because a diameter of the probe beam was larger compare to that of hologram. Measured refractive index modulation and high brightness of holograms recorded by the second harmonic observed by naked eyes showed that high efficiency holograms can be recorded by means of this technology.

Another experiment was done with the use of focused beams at approximately 532 nm on then apparatus of FIG. 4. It was found that recorded hologram focused the diffracted beams to a small spot of several micrometers. This result evidences that the proposed two-step technology of hologram recording provides fabrication of complex holographic elements for visible spectral region.

Summarizing the previous discussions, one can describe nonlinear sensitivity of PTR glass to visible radiation in the following terms. Exposure of PTG glass to UV radiation within absorption band of Ce$^{3+}$ resulted in generation of several new structural elements of PTR glass. They are photo ionized cerium (Ce$^{3+}$)$^+$, photoreduced silver Ag$^0$, and other electron color centers of PTR glass matrix. Photo reduced silver and its aggregates are the primary centers for all further structural transformation in PTR glass. Thus, the final value of induced refractive index is approximately proportional to concentration of photoreduced silver centers. Those centers have absorption in UV spectral region and could not be destroyed by illumination to visible radiation. However, exposure of PTR glass having photoreduced silver centers to high-power visible radiation causes their bleaching. The exact mechanism of bleaching of silver centers is not yet clear. It appears to be is a nonlinear mechanism because bleaching does not occur at power density of visible radiation below approximately 10 MW/cm$^2$. Thermal development of the PTR glass blank underwent consequent UV and high-power visible radiation results in following structural transformation. Unexposed area demonstrates spontaneous cystallization only which results in decreasing of its refractive index. The rate of this crystallization is significantly lower that that in UV exposed area where photoinduced crystallization with high rate occurs. This process results in stronger decreasing of refractive index in exposed area compare to that in unexposed one. Difference in those refractive indices is a mechanism of UV hologram recording. The second exposure of the UV exposed PTR glass blank results in partial nonlinear transformation of nucleation centers. Therefore, decrease of refractive index in a double exposed area is higher that in unexposed are but lower that that in UV exposed area. Difference between refractive indices in UV exposed and double exposed area is enough for hologram recording by visible radiation.

Figure 6:
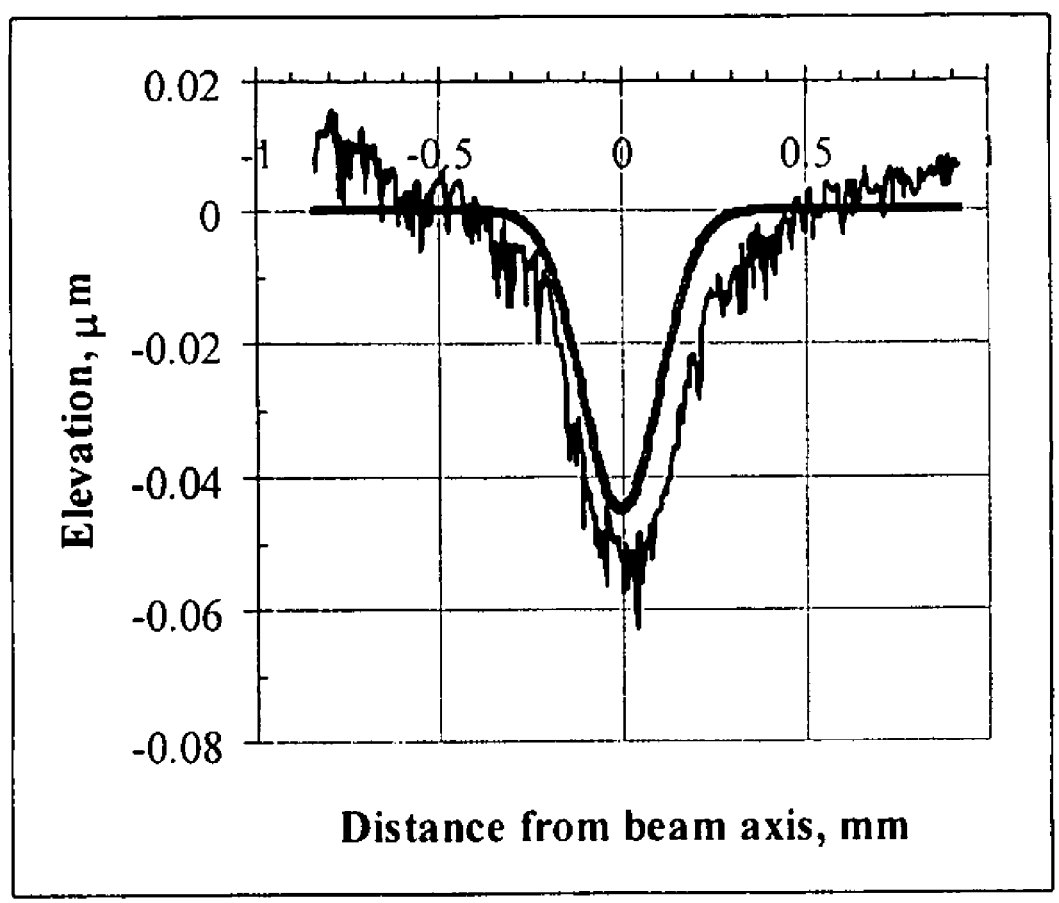

This phenomenon gives additional opportunity to record not only diffractive optical elements based in modulation of a refractive index but refractive optical elements based on increment of refractive index, such as focusing lenses and waveguides. A third experiment was done with the use of single beams of the second harmonic of Nd-laser for the secondary illumination of PTR glass blanks exposed to UV radiation. Both collimated and focused beams at approximately 532 nm were launched to a UV exposed PTR glass blank. After thermal development, the transparent channels with a modified refractive index were observed in the bulk of the PTR glass sample. Because of radial distribution of power density in the writing laser beams, the exposed area showed radial distribution of refractive index as it was shown in FIG. 3 and surface distortions caused by difference of crystalline phase concentration in the volume of PTR glass after single and two-step exposures (FIG. 6).

This phenomenon for single UV irradiation was described by L. B. Glebov and L. Glebov (see: Swelling of photo-thermo-refractive glass resulted from thermal development. *Glass Science and Technology* 75 C2 (2002) 294-297). It is important to noted that after UV irradiation, exposed area is elevated compare to the surface unexposed region. In contrast, the area exposed to high power visible radiation is depressed compared to the UV irradiated region for several tens of nanometers (FIG. 6).

Excitation of those channels with collimated and focused laser beams has shown that they work as positive lenses with gradient refractive index which focused laser beams. On the other hand, those channels worked as waveguides delivering laser beam to the opposite side of the sample. This means that two-step technology of PTR glass treatment provides fabrication of refractive optical elements and can be widely used for optical networking design.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. A method of efficiently generating holograms from photo-thermo-refractive (PTR) glasses having a diffraction efficiency of at least approximately 90%, comprising the steps of:
   providing a PTR glass blank having a total contamination with iron and heavy metals of a few ppm;
   exposing the PTR glass blank with a UV light source or other source of ionizing radiation to create precursors of nucleation centers which are color centers;
   generating a visible light having an intensity greater than approximately 10 MW/cm$^2$;
   exposing the UV exposed PTR glass blank containing precursors of nucleation centers with the high intensity visible light greater than approximately 10 MW/cm$^2$ to decrease concentration of the precursors to decrease the rate of crystallization at the development stage to increase a refractive index in the PTR glass after exposure to the visible light to record the hologram, wherein the visible light exposure of the UV exposed PTR glass blank causes a nonlinear transformation of nucleation centers;
   thermal treating the PTR glass exposed to both the UV and visible radiation to provide phase transformation depending on an amount and intensity of a visible radiation to allow crystal growth in the UV exposed area using a nonlinear mechanism for destruction of nucleation centers in the area exposed to visible light;
   cooling the thermal treated PTR glass to room temperature to provide refractive index variations according to the amount and intensity of the visible radiation, wherein a difference between refractive indices in the UV exposed areas and the UV and visible light exposed areas allows hologram recording by visible light radiation; and
   replaying the hologram from the exposed and thermal treated PTR glass by long wavelength radiation.

2. The method of claim 1, wherein the step of exposing with UV light source includes a range of approximately 280 to approximately 350 nm.

3. The method of claim 1, wherein the step of exposing with the UV light source is approximately 325 nm.

4. The method of claim 1, wherein the step of exposing with visible light source includes a range of approximately 450 to approximately 600 nm.

5. The method of claim 1, wherein the step of exposing with a visible light source includes: approximately 532 nm.

6. The method of claim 1, wherein the step of exposing with a visible light source includes: a high intensity source generating at approximately 10 megawatts/cm$^2$ to approximately 100 gigawatts/cm$^2$.

7. The method of claim 6, wherein the high intensity visible light is approximately 100 megawatts/cm$^2$.

8. The method of claim 6, wherein the high intensity visible light is approximately 10 gigawatts/cm$^2$.

9. The method of claim 1, wherein the step of generating a hologram includes the step of:
   generating a simple hologram having substantially planar surfaces of equal refractive index.

10. The method of claim 1, wherein the step of generating a hologram includes the step of:
    generating a complex hologram having substantially curved surfaces of equl refractive index.

11. The method of claim 1, wherein the step of thermal treating includes the step of:
    thermal treating the PTR glass in a temperature region ranging from approximately 480 to approximately 580° C. for a period of from a few minutes to several hours appropriate for phase transformation.

12. A method of generating optical components from photo-thermo-refractive (PTR) glasses, comprising the steps of:
    providing a PTR glass blank having a total contamination with iron and heavy metals of a few per million;
    exposing the entire PTR glass blank with a UV light having a wavelength within the limits of the UV spectrum to produce precursors of nucleation centers which are color centers;
    generating a high intensity visible light greater than approximately 10 MW/cm$^2$;
    exposing the UV exposed PTR glass with the high-intensity visible light for optical excitation of the color centers to partially bleach the color centers to record a phase hologram by refractive index modulation, the partial bleaching being non linear due to the high-intensity visible light exposure;
    thermal treating the UV and visible light exposed PTR glass; and
    cooling the thermal treated PTR glass to generate a holographic optical component from the thermal treated PTR glass for a visible region.

13. The method of claim 12, wherein the cooling step to generate the optical component includes the step of:
    generating the optical component from one of a lens or multi-lens objective, a combination of a prism or mirror with lenses, and a divergent/convergent beam splitter/combiner.

14. An apparatus comprising:
    a photo sensitive refractive (PTR) glass;
    a UV source for exposing the PTR glass to produce a PTR glass having photosensitivity to visible light caused by the UV exposure to create precursors of nucleation centers which are color centers in the PTR glass, the PTR glass having a total contamination with iron and heavy metals of a few parts per million,
    a visible light source for exposing the UV exposed PTR glass which is operating to generate a high intensity visible light greater than approximately 10 MW/cm$^2$ to decrease concentration of the precursors of nucleation center to decrease the rate of crystallization at the development stage to increase a refractive index in the PTR glass after exposure to the visible light for non linear transformation of the nucleation centers;

a heating unit for thermal treating the UV and visible light treated PTR glass to provide phase transformation depending on an amount and intensity of visible radiation to allow crystal growth in the UV exposed area using a nonlinear mechanism for destruction of nucleation centers in an area exposed to visible light to fabricated a hologram or a phase plate from the PTR glass for a visible region, the hologram generated by refractive index modulator; and means for using the PTR glass as one of a refractive and a diffractive volume holographic optical element based on modulation of a refractive index.

15. The apparatus of claim 14, wherein the UV exposure includes a range of approximately 280 nm to approximately 350 nm.

16. The apparatus of claim 15, wherein the UV exposure is approximately 325 nm.

17. The apparatus of claim 14, wherein the visible light exposure includes a range of approximately 450 nm to approximately 600 nm.

18. The apparatus of claim 17, wherein the visible light exposure is approximately 532 nm.

19. The apparatus of claim 14, wherein the thermal treatment means includes a range of approximately 480 to approximately 580° C. for a period of from a few minutes to several hours appropriate for phase transformation.

20. The apparatus of claim 14, wherein the holographic optical element includes: a simple hologram having substantially planar surfaces of equal refractive index.

21. The apparatus of claim 14, wherein the holographic optical element includes: a complex hologram having substantially curved surfaces of equal refractive index.

22. A method of generating refractive optical elements from photo-thermo-refractive (PTR) glasses, comprising the steps of:

providing a PTR glass having a total contamination with iron and heavy metals of a few parts per million;

exposing PTR glass with a source of UV radiation for generation of precursors of nucleation centers which are color centers;

generating a visible light having an intensity greater than 10 $MW/cm^2$;

exposing the UV exposed PTR glass with a high-intensity visible light source to decrease concentration of the precursors of nucleation centers to decrease the rate of crystallization at the development stage to increase a refractive index in the PTR glass after exposure to the visible light for a nonlinear transformation of nucleation centers;

thermal treating the UV and visible light exposed PTR glass to provide phase transformation depending on an amount and intensity of visible light radiation to allow crystal growth in the UV exposed area using a nonlinear mechanism for destruction of nucleation centers in the area exposed to visible light, wherein after thermal treatment a refractive index in the UV and Visible light exposed area is higher than in a single exposed area and lower than in unexposed areas; and replaying a hologram from the exposed and thermal treated PTR glass.

23. The method of claim 22 wherein the source of ionizing radiation is a UV light source.

24. The method of claim 22, wherein the refractive optical elements are lenses, waveguides, waveguide arrays, a multiplexer, demultiplexer and a combination multiplexer/demultiplexer devices.

* * * * *